United States Patent
Yamagiwa et al.

(10) Patent No.: US 7,337,423 B2
(45) Date of Patent: Feb. 26, 2008

(54) MASK PATTERN GENERATING METHOD AND MASK PATTERN GENERATING APPARATUS

(75) Inventors: Minoru Yamagiwa, Takatsuki (JP); Tadashi Tanimoto, Otsu (JP); Akio Misaka, Suita (JP); Reiko Hinogami, Kawabe-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 724 days.

(21) Appl. No.: 10/778,337

(22) Filed: Feb. 17, 2004

(65) Prior Publication Data

US 2004/0191644 A1 Sep. 30, 2004

(30) Foreign Application Priority Data

Feb. 19, 2003 (JP) ............................. 2003-040575

(51) Int. Cl.
*G06F 17/50* (2006.01)
(52) U.S. Cl. .......................................... 716/19; 716/21
(58) Field of Classification Search ............. 716/19–21
See application file for complete search history.

(56) References Cited

U.S. PATENT DOCUMENTS

| | | | | |
|---|---|---|---|---|
| 5,705,301 A | * | 1/1998 | Garza et al. ................... | 430/5 |
| 5,900,338 A | * | 5/1999 | Garza et al. ................... | 430/5 |
| 5,972,541 A | * | 10/1999 | Sugasawara et al. ........... | 430/5 |
| 6,183,916 B1 | | 2/2001 | Kuo et al. | |
| 6,282,696 B1 | * | 8/2001 | Garza et al. ................... | 716/19 |
| 6,400,838 B2 | * | 6/2002 | Watanabe ................... | 382/144 |
| 7,060,398 B2 | * | 6/2006 | Misaka ........................... | 430/5 |
| 7,139,996 B2 | * | 11/2006 | Ohnuma et al. ............... | 716/19 |
| 2003/0077521 A1 | * | 4/2003 | Meier et al. ................... | 430/5 |
| 2007/0028195 A1 | * | 2/2007 | Chidambarrao et al. ........ | 716/2 |

* cited by examiner

*Primary Examiner*—Jack Chiang
*Assistant Examiner*—Brandon Bowers
(74) *Attorney, Agent, or Firm*—Stevens, Davis, Miller & Mosher, LLP

(57) ABSTRACT

Established is a mask pattern correcting technique for reducing the load to a mask CAD process and for ensuring the minimum dimension defined in an OPC process. A method comprises the steps of: measuring a line width of a mask pattern; extracting edges where the line width of the mask pattern is smaller than a predetermined dimension; generating a central geometrical object having a predetermined width relative to the center between the edges where the line width is smaller than the predetermined dimension; and replacing the portion of the mask pattern where the line width is smaller than the predetermined dimension with the central geometrical object. As a result, the mask pattern line width is changed into the predetermined with dimension of the central geometrical object. This reduces notably the number of geometrical object calculating steps that had been performed for each value of dimension on the basis of a correction table in the prior art, and thereby shortens the mask CAD processing time.

3 Claims, 6 Drawing Sheets

| Pattern line width | Line width correction |
|---|---|
| 130nm ≦ L < 132nm | δ = +10nm |
| 132nm ≦ L < 134nm | δ = +8nm |
| 134nm ≦ L < 136nm | δ = +6nm |
| 136nm ≦ L < 138nm | δ = +4nm |
| 138nm ≦ L < 140nm | δ = +2nm |

| Pattern | Line width correction |
|---|---|
| 170nm ≦ S < 172nm | δ = −5nm |
| 172nm ≦ S < 174nm | δ = −4nm |
| 174nm ≦ S < 176nm | δ = −3nm |
| 176nm ≦ S < 178nm | δ = −2nm |
| 178nm ≦ S < 180nm | δ = −1nm |

MASK PATTERN GENERATING METHOD AND MASK PATTERN GENERATING APPARATUS

BACKGROUND OF THE INVENTION

1. Field of the Invention

The present invention relates to photomask data processing technology for avoiding wafer pattern degradation due to insufficiency in the resolution of a stepper in semiconductor fabrication processes. In particular, the present invention relates to a mask pattern generating method and a mask pattern generating apparatus used in the generation of geometrical object patterns of photomask data.

2. Related Art of the Invention

In optical proximity correction (OPC) for processing photomask data so as to avoid pattern degradation on the wafer, it is indispensable to ensure the minimum line width and the minimum gap defined in photomask data.

In a prior art mask CAD processing technique, pattern line widths and pattern gaps are measured stepwise. Then, calculation is performed for each value of the dimension according to a correction table.

For example, in the case that the minimum pattern line width is ensured such that a pattern line width (L) 1 smaller than 140 nm is set into 140 nm as shown in FIG. 5, a line width correction (δ) 2 is set as follows.

When an edge line width greater than or equal to 130 nm and smaller than 132 nm is detected, the width is expanded by 10 nm.

When an edge line width greater than or equal to 132 nm and smaller than 134 nm is detected, the width is expanded by 8 nm.

. . .

When an edge line width greater than or equal to 138 nm and smaller than 140 nm is detected, the width is expanded by 2 nm.

As such, line width correction is performed depending on the value of each pattern line width 1.

On the other hand, in the case that the minimum pattern gap is ensured such that a pattern gap (S) 3 smaller than 180 nm is set into 180 nm as shown in FIG. 6, a line width correction (δ) 4 is set as follows.

When an edge pattern gap greater than or equal to 170 nm and smaller than 172 nm is detected, corresponding line widths are reduced by 5 nm each.

When an edge pattern gap greater than or equal to 172 nm and smaller than 174 nm is detected, corresponding line widths are reduced by 4 nm each.

. . .

When an edge pattern gap greater than or equal to 178 nm and smaller than 180 nm is detected, corresponding line widths are reduced by 1 nm each.

As such, line width correction is performed depending on the value of each pattern gap 3.

Such a prior art technique is disclosed in Japanese Laid-Open Patent Publication No. 2001-83689 entitled "Pattern correction method for semiconductor manufacturing mask, and recording medium recorded with the pattern correction method" (page 2 and Claims 1 and 2) and in Japanese Laid-Open Patent Publication No. H08-321450 entitled "Correction of mask pattern, formation of pattern, and photomask".

Nevertheless, in such a prior art CAD processing technique where pattern line widths and pattern gaps are measured stepwise and then geometrical object logic calculation is performed for each value of dimension, the number of steps of correcting the pattern line widths is growing with increasing complexity in the OPC process caused by recent fine-structuring and integration-enhancement of semiconductor devices. This has increased the complexity in the mask CAD processing. As long as the prior art geometrical object logic calculation algorithm is used, the load to the mask CAD process will unavoidably continue to grow with the increase in the number of steps associated with the increase in the complexity in the OPC process.

SUMMARY OF THE INVENTION

An object of the invention is to provide a mask pattern generating method and a mask pattern generating apparatus permitting the establishing of a mask pattern correcting technique for reducing the load to a mask CAD process and for ensuring the minimum dimension defined in an OPC process, so as to speed up the CAD process and ensure the OPC pattern reliability in rule-based OPC.

A first aspect of the invention for achieving this object is a mask pattern generating method used for forming a desired mask pattern on a wafer by means of a projection optical system in a wafer process, comprising the steps of: measuring a line width of the mask pattern; generating a central geometrical object having a predetermined width relative to the center between the edges of the line width of the mask pattern; and deforming the mask pattern by using the central geometrical object.

This configuration permits the process of ensuring the defined line width dimension in the OPC-processed mask pattern. Further, a central geometrical object satisfying the defined dimension is generated in a common manner, so as to change the line width of the mask pattern into the predetermined width dimension of the central geometrical object. This reduces notably the number of geometrical object calculating steps that had been performed for each value of dimension on the basis of a correction table in the prior art, and thereby shortens the mask CAD processing time.

A second aspect of the invention is a mask pattern generating method used for forming a desired mask pattern on a wafer by means of a projection optical system in a wafer process, comprising the steps of: measuring a gap of the mask pattern; generating a central geometrical object having a predetermined width relative to the center between the edges of the gap of the mask pattern; and deforming the mask pattern by using the central geometrical object.

This configuration permits the process of ensuring the defined gap dimension in the OPC-processed mask pattern. Further, a central geometrical object satisfying the defined dimension is generated in a common manner, so as to change the gap of the mask pattern into a predetermined gap dimension corresponding to the predetermined width dimension of the central geometrical object. This reduces notably the number of geometrical object calculating steps that had been performed for each value of dimension on the basis of a correction table in the prior art, and thereby shortens the mask CAD processing time.

A third aspect of the invention is a mask pattern generating method comprising a mask pattern correcting step for processing photomask data to be generated on a wafer by means of a projection optical system in a wafer process and for generating thereby a desired mask pattern, wherein the mask pattern correcting step comprises the steps of: measuring a line width of the mask pattern; extracting edges where the line width of the mask pattern is smaller than a predetermined dimension; generating a central geometrical object having a predetermined width relative to the center between the edges where the line width is smaller than the predetermined dimension; and replacing the portion of the mask pattern where the line width is smaller than the predetermined dimension with the central geometrical object, and thereby changing the line width of the mask pattern.

Similarly to the invention according to the first aspect, this configuration permits the changing of the line width of the mask pattern into the predetermined width dimension of the central geometrical object. At this time, the geometrical object logic calculation performed on the OPC-processed mask pattern by using the central geometrical object permits the ensuring of the defined line width dimension in a common manner even for all edges that did not satisfy the defined line width dimension of the mask pattern.

A fourth aspect of the invention is a mask pattern generating method comprising a mask pattern correcting step for processing photomask data to be generated on a wafer by means of a projection optical system in a wafer process and for generating thereby a desired mask pattern, wherein the mask pattern correcting step comprises the steps of: measuring a gap of the mask pattern; extracting edges where the gap of the mask pattern is smaller than a predetermined dimension; generating a central geometrical object having a predetermined width relative to the center between the edges where the gap is smaller than the predetermined dimension; and performing a NOT operation based on the central geometrical object onto the portion of the mask pattern where the gap is smaller than the predetermined dimension, and thereby changing the gap of the mask pattern.

Similarly to the invention according to the second aspect, this configuration permits the changing the gap of the mask pattern into a predetermined gap dimension corresponding to the predetermined width dimension of the central geometrical object. At this time, the geometrical object logic calculation performed on the OPC-processed mask pattern by using the central geometrical object permits the ensuring of the defined gap dimension in a common manner even for all edges that did not satisfy the defined gap dimension of the mask pattern.

A fifth aspect of the invention is a mask pattern generating apparatus using the mask pattern generating method according to Claim 3 and thereby generating a mask pattern having a line width of a predetermined dimension.

This reduces notably the number of geometrical object logic calculating steps, and thereby shortens the CAD processing time.

A sixth aspect of the invention is a mask pattern generating apparatus using the mask pattern generating method according to Claim 4 and thereby generating a mask pattern having a gap of a predetermined dimension.

This reduces notably the number of geometrical object logic calculating steps, and thereby shortens the CAD processing time.

DETAILED DESCRIPTION OF THE INVENTION

Figure 1:
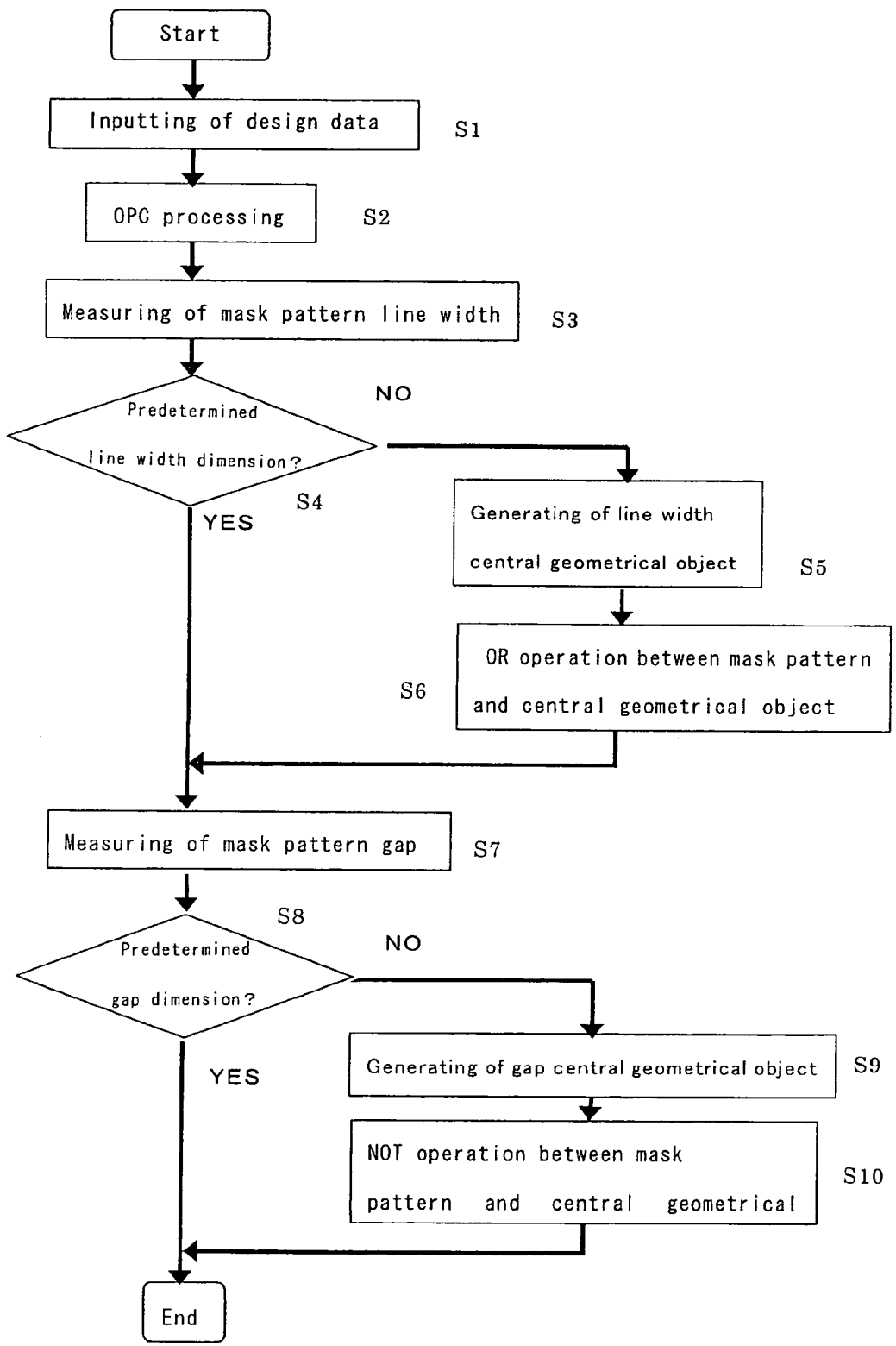
FIG. 1 is a flowchart of a mask pattern generating method according to an embodiment of the invention.
Figure 2:
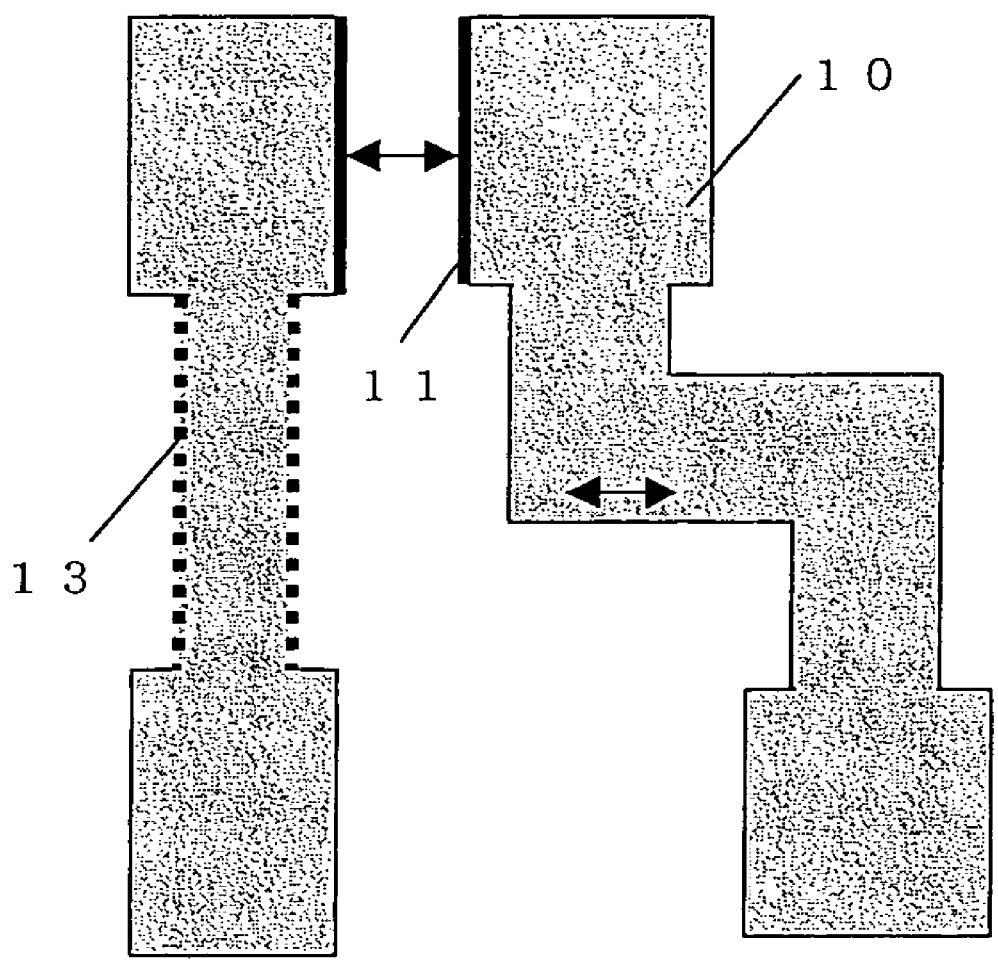
FIG. 2 is a pattern plan view of a central geometrical object generation region according to an embodiment of the invention.
Figure 3:
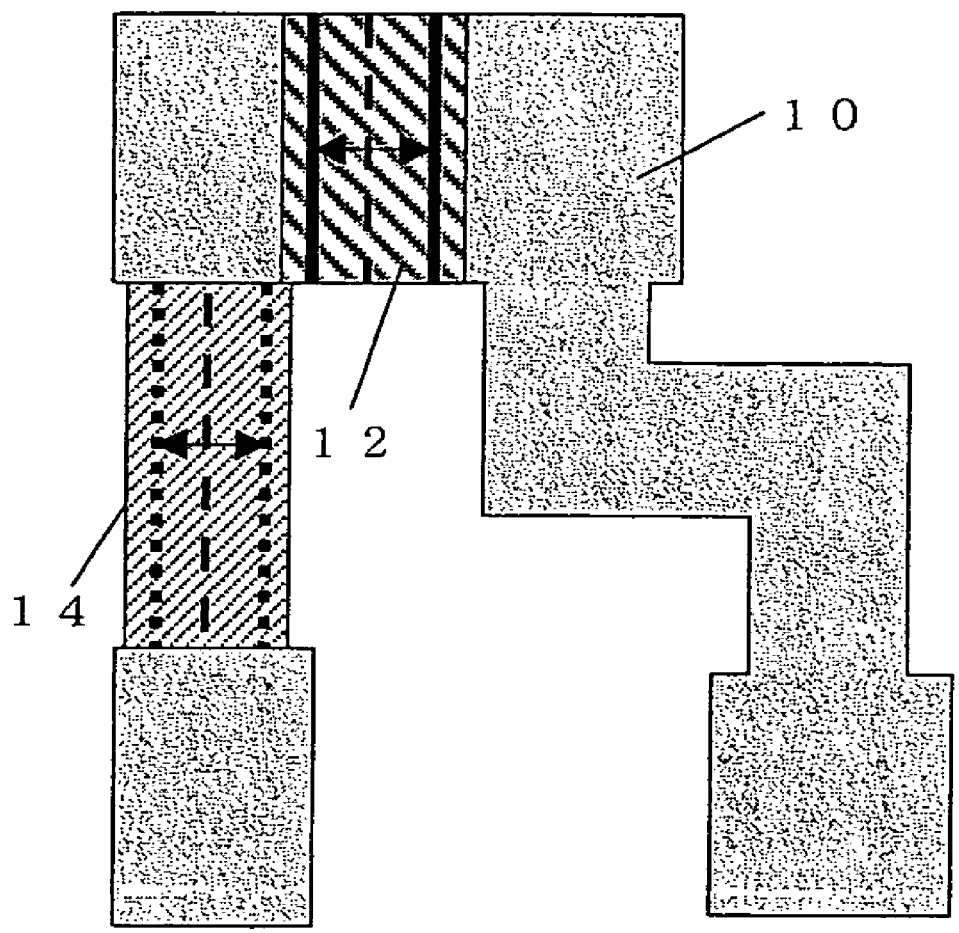
FIG. 3 is a diagram illustrating a central geometrical object generating process according to an embodiment of the invention.
Figure 4:
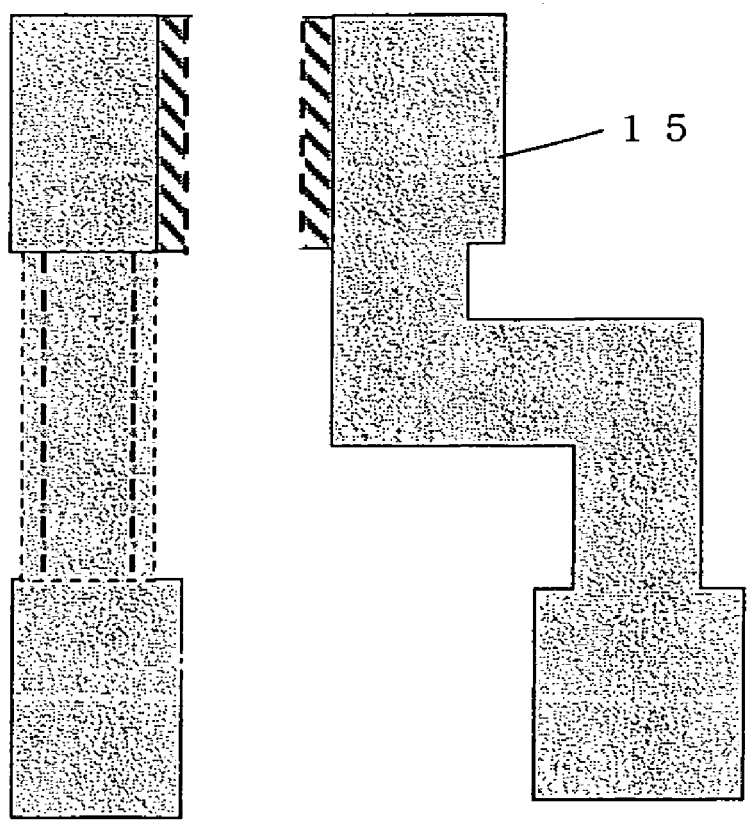
FIG. 4 is a diagram illustrating a mask pattern having been processed into a standard dimension according to an embodiment of the invention.
Figure 5:
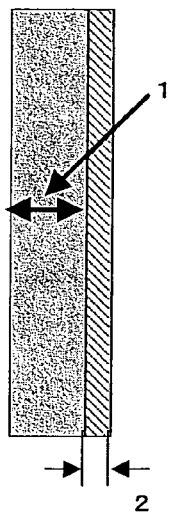
FIG. 5 is a diagram illustrating a prior art mask pattern line width correcting technique.
Figure 6:
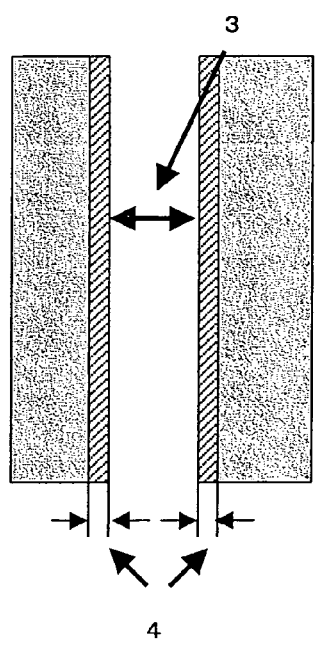
FIG. 6 is a diagram illustrating a prior art mask pattern gap correcting technique.

A first embodiment of the invention is described below with reference to FIGS. 1-4. FIG. 1 is a flowchart of a mask pattern generating method using two algorithm techniques according to the embodiment of the invention. FIG. 2 is a pattern plan view of a central geometrical object generation region according to the embodiment of the invention. FIG. 3 is a diagram illustrating a central geometrical object generating process according to the embodiment of the invention. FIG. 4 is a diagram illustrating a mask pattern having been processed into a standard dimension according to the embodiment of the invention.

As shown in FIGS. 1-4, a method according to this embodiment comprises a mask pattern correcting step (S1 and S2) for processing photomask data to be generated on a wafer by means of a projection optical system in a wafer process and for generating thereby a desired mask pattern. The mask pattern correcting step comprises: the step (S3) of measuring a line width of the mask pattern 10; the step (S5) of generating a central geometrical object 14 having a predetermined width relative to the center between the edges 13 of the line width of the mask pattern 10; and the step (S6) of deforming the mask pattern 10 by using the central geometrical object 14.

In this case, as shown in FIG. 2, a line width of an OPC-processed mask pattern 10 is measured, so that edges 13 having a line width smaller than a defined dimension are extracted (S3 and S4). Then, as shown in FIG. 3, generated (S5) is a central geometrical object 14 having a width satisfying the defined dimension relative to the center between the edges 13 having a line width smaller than the defined dimension. Then, as shown in FIG. 4, an OR operation of geometrical object logic calculation is performed (S6) on the OPC-processed mask pattern 10 by using the central geometrical object 14. As a result, the portion of the mask pattern 10 having a line width smaller than the predetermined dimension is replaced by the central geometrical object 14, so that the mask pattern line width is changed into the predetermined dimension. As a result, obtained is a mask pattern 15 having processed by defined dimension ensuring.

As such, the geometrical object logic calculation performed on the mask pattern by using the central geometrical object permits the ensuring of the defined line width dimension in a common manner even for all edges that did not satisfy the defined line width dimension of the OPC-processed mask pattern.

A second embodiment of the invention is described below with reference to the same FIGS. 1-4 as used in the description of the first embodiment.

As shown in FIGS. 1-4, a method according to this embodiment comprises a mask pattern correcting step (S1 and S2) for processing photo mask data to be generated on a wafer by means of a projection optical system in a wafer process and for generating thereby a desired mask pattern. The mask pattern correcting step comprises: the step (S7) of measuring a gap of the mask pattern 10; the step (S9) of generating a central geometrical object 12 having a predetermined width relative to the center between the edges 11 of the gap of the mask pattern 10; and the step (S10) of deforming the mask pattern 10 by using the central geometrical object 12.

In this case, as shown in FIG. 2, after the process of the first embodiment, a gap of an OPC-processed mask pattern 10 is measured, so that edges 11 having a gap smaller than a defined dimension are extracted (S7 and S8). Then, as shown in FIG. 3, generated (S9) is a central geometrical object 12 having a width satisfying the defined dimension relative to the center between the edges 11 having a line width smaller than the defined dimension. Then, as shown in FIG. 4, a NOT operation of geometrical object logic calculation is performed (S10) on the OPC-processed mask pattern 10 by using the central geometrical object 12. As a result, an area corresponding to the central geometrical object 12 is subtracted from the mask pattern 10 in the gap portion having a gap smaller than the predetermined dimension, so that the mask pattern gap is changed into the predetermined dimension. As a result, obtained is a mask pattern 15 having processed by defined dimension ensuring.

As such, the geometrical object logic calculation performed on the mask pattern by using the central geometrical object permits the ensuring of the defined gap dimension in a common manner even for all edges that did not satisfy the defined gap dimension of the OPC-processed mask pattern.

Although the flowchart of FIG. 1 includes the processes of the first embodiment and the second embodiment, the method of the invention may be configured such as to comprise these processes or either process.

What is claimed is:

1. A mask pattern generating method used for forming a desired mask pattern on a wafer by way of a projection optical system in a wafer process, the method comprising the steps of:

measuring a line width of the mask pattern;

generating a line symmetry geometrical object having a predetermined width relative to a center line between the edges of the line width of the mask pattern; and deforming the mask pattern by using the line symmetry geometrical object.

2. A mask pattern generating method comprising a mask pattern correcting step for processing photomask data to be generated on a wafer by way of a projection optical system in a wafer process and for generating thereby a desired mask pattern, wherein the mask pattern correcting step comprises the steps of:

measuring a line width of the mask pattern;

extracting edges where the line width of the mask pattern is smaller than a predetermined dimension;

generating a line symmetry geometrical object having a predetermined width relative to a center line between the edges where the line width is smaller than the predetermined dimension; and replacing the portion of the mask pattern where the line width is smaller than the predetermined dimension with the line symmetry geometrical object, and thereby changing the line width of the mask pattern.

3. A mask pattern generating apparatus using the mask pattern generating method according to claim 2 and thereby generating a mask pattern having a line width of a predetermined dimension.

* * * * *